United States Patent
Kahlman et al.

[11] Patent Number: 5,140,474
[45] Date of Patent: Aug. 18, 1992

[54] DEVICE FOR RECORDING A DIGITAL INFORMATION SIGNAL ON A RECORD CARRIER

[75] Inventors: Josephus A. H. M. Kahlman; Kornelis A. Schouhamer Immink, both of Eindhoven, Netherlands

[73] Assignee: U.S. Philips Corporation, New York, N.Y.

[21] Appl. No.: 712,166

[22] Filed: Jun. 6, 1991

[30] Foreign Application Priority Data

Sep. 21, 1990 [NL] Netherlands .......... 9002070

[51] Int. Cl.⁵ .............................. G11B 5/09
[52] U.S. Cl. .................. 360/40; 341/39
[58] Field of Search ........ 360/39, 40; 375/19, 375/20; 341/59, 55

[56] References Cited
U.S. PATENT DOCUMENTS

4,779,072 10/1988 Van Gestel .......... 360/40
4,914,438 4/1990 Kameyama .......... 360/40

Primary Examiner—Vincent P. Canney
Attorney, Agent, or Firm—Leroy Eason

[57] ABSTRACT

In a run length limited digital signal of the d,k type, (d+m)-bit digital words are inserted at specific instants in the data stream in a manner such that the signal thus obtained is a run length limited signal of the d,k' type, where k' is greater than or equal to k. This signal is then encoded in an aT precoder, a being an integer such that a ≧ 1, and recorded on a magnetic record carrier (21). Such (d+m)-bit digital words are inserted so that the digital sum value of the output signal of the precoder has a desired pattern as a function of time. Thus, for example, a pilot signal can be accommodated in the output data stream of the precoder, which pilot signal can be detected during reproduction of the recorded signal. From this detected pilot signal a control signal can be derived for controlling tracking during reproduction of the recorded signal.

19 Claims, 9 Drawing Sheets

DEVICE FOR RECORDING A DIGITAL INFORMATION SIGNAL ON A RECORD CARRIER

RELATED APPLICATION

This invention is related to copending application Ser. No. 07/712,167, filed concurrently herewith, of which one of the inventors hereof is a named co-inventor. Both relate to encoding of a digital information signal so as to adjust the running digital sum value thereof, but provide different modes of such encoding.

BACKGROUND OF THE INVENTION

1. Field of the Invention

The invention relates to a device for recording a digital information signal in an information track of a record carrier, comprising:

an input terminal for receiving the digital information signal, an encoding device having an input coupled to the input terminal and having an output, which encoding device comprises an aT precoder, where a is an integer greater than or equal to 1 and T is the bit period of the signal, and, a recording device having an input coupled to the output of the encoding device, for recording the encoded digital information signal in the information track on the record carrier.

2. Description of the Related Art

A device of this type is known, for example, from European Patent Application No. 339,724 encoding in such device is described according to which an n-bit information word is converted into an (n+m)-bit channel word by using a look-up table, subsequent to which the channel word is applied by a 2T precoder to a recording device for recording the thus encoded (n+m)-bit channel word on a magnetic record carrier. More specifically, an 8-to-10 bit conversion is described in which for each 8-bit information word no less than three 10-bit words from the aforementioned table are available having mutually different disparities.

With an appropriate selection from these three 10-bit words the digital sum value of the serial data stream of the channel word at the output of the precoder can be controlled in such a way that a desired variation of the digital sum value as a function of time is realised.

The above publication a pilot signal is thus accommodated in the serial data stream and which when reproduced from the record carrier may, for example, be used to control tracking.

SUMMARY OF THE INVENTION

It is an object of the invention to provide a device with which it is likewise possible to adjust as desired the current digital sum value as a function of time, but in which a different encoding is used which encoding may have a simpler structure as, applied to a specific digital information signal.

Therefore, the device according to the invention is characterized in that the digital information signal has the form of a run length limited signal of the d,k type, the encoding device comprising signal extending means for inserting at specific points in time a (d+m)-bit digital word into the digital information signal, where m is an integer grater than or equal to 1. The precoder is arranged for converting the extended digital information signal thus obtained into a channel signal for recording in the track on the record carrier. The encoding device further includes control signal generating means arranged for receiving the channel signal and deriving a control signal therefrom. The inserts (d+m)-bit digital words into the digital information signal in response to this control signal so that the information signal produced by the signal extending means is a run length signal of the d,k'type, where k' is an integer greater than or equal to k and, furthermore, so that the running digital sum value of the precoder output signal has a desired pattern as a function of time.

The parameters d and k of a in the run length limited digital information signal of the d,k type denote integers such that no less than d and no more than k "zeros" occur between any two successive "ones" in this signal.

Encoding the information signal in the device according to the invention is thus realised in a simple manner by inserting (d+m)-bit digital words into the digital information signal at specific points of time. Assuming that m is equal to 1, this means for d=1 that 2-bit digital words are inserted each time, and for d=2 that 3-bit digital words are inserted, and so on. The points of time of the insertions may be equidistant time intervals apart. This is not a necessity, however.

BRIEF DESCRIPTION OF THE DRAWINGS

The invention will be further explained in the following description of the Figures with reference to a number of exemplary embodiments, in which.

DESCRIPTION OF THE PREFERRED EMBODIMENTS

A run length limited digital information signal of the d,k type denotes that for the successive "ones" and "zeros" in the serial data stream of the digital information signal the following requirements are valid:

there are at least d "zero" bits between every two successive "one" bits in the digital information signal. Worded differently, there are never two directly successive "one" bits;

there are at most k "zero" bits between two successive "one" bits in the digital information signal. d and k are integers for which holds $d \geq 1$ and $K \geq 1$.

Figure 1A:
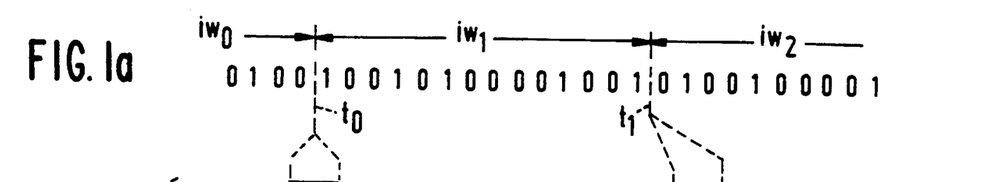
FIG. 1 (*a*, *b*, *c* and *d*) shows a run length limited digital information signal of the d,k type to be encoded into a channel signal.

FIG. 1a shows an example of a serial data stream of a run length limited digital information signal where d=1. Thus, there is at least one "zero" between successive "ones" in this signal.

According to the invention, a (d+m)-bit digital word is inserted into the serial data stream at specific instants $t_0, t_1, \ldots$. In the present example m is equal to 1. The instants may lie fixed intervals apart. This is not a necessity, however. For the example shown in FIG. 1a this means that 2-bit digital words are inserted. Basically, there are four options for each extension i.e. the words "00", "01", "10" and "11".

According to the invention there is a further requirement that after a (d+1)-bit digital word has been inserted, the data stream so obtained must also meet the requirements which are valid for a run length limited digital information signal of the d,k' type, where $k' \geq k$.

This means, for example, that the resultant data stream after the insertion is to meet the requirement that there is at least one "zero" between two successive "ones" in the data stream. Therefore, the digital word "11" must be omitted. In addition, the first bit after the instant $t_0$ in the information signal is a "1", so that at the instant $t_0$ the digital word "01" cannot be inserted either. Thus, there are two possibilities left which are shown in FIG. 1b, where in the top line of numbers the digital word "00" is inserted, and in FIG. 1c wherein in the top line of numbers the digital word "10" is inserted.

The insertion of the digital word "00" into the data stream of FIG. 1a may means that the number of "zeros" between two successive "ones" exceeds k. For k'=k this would means that such insertion is also prohibited.

Figure 1B:
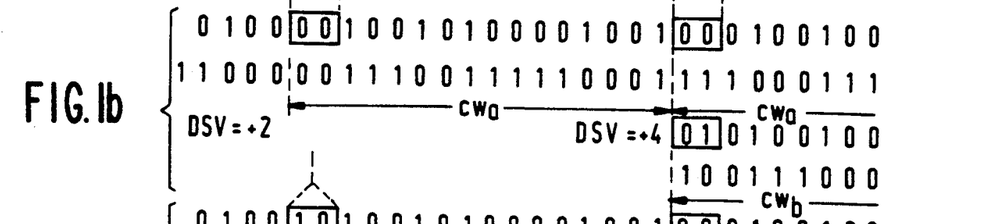
Figures 1C, 1D:
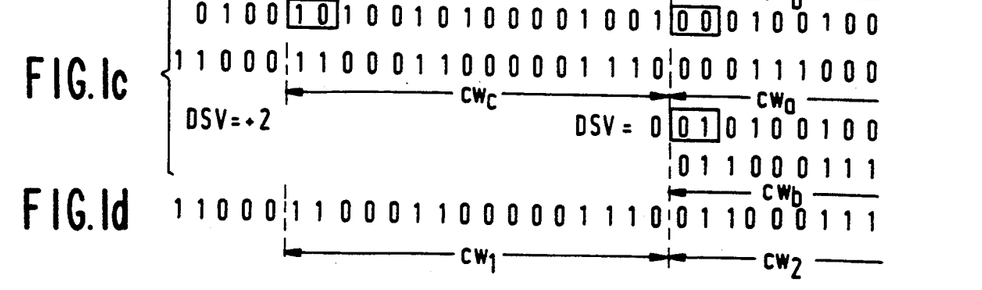

FIGS. 1b and 1c show that for the insertion succeeding the instant $t_1$ only the 2-bit digital words "00" and "01" are available.

Figure 2:
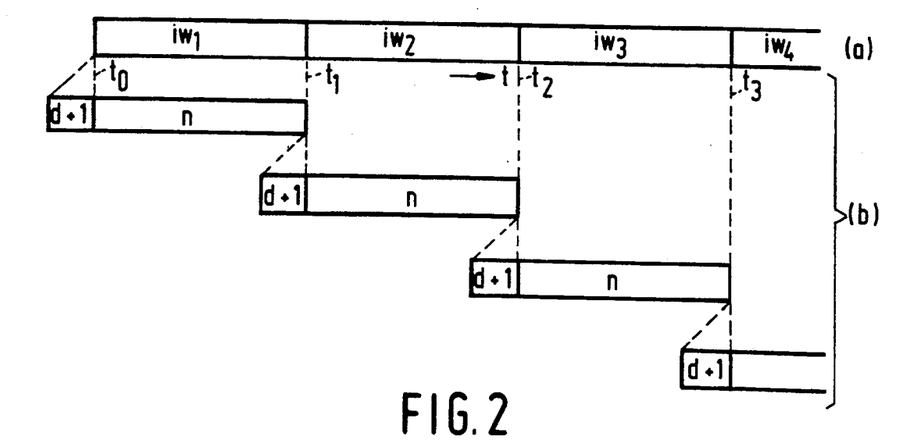
FIG. 2 shows in a diagrammatic manner the insertion of (d+m)-bit digital words into the serial data stream of the information signal.

FIG. 2a shows in a more diagrammatic manner the serial data stream of FIG. 1a, where at the instants $t_0, t_1, t_2, t_3, \ldots$ the (d+1)-bit digital words are inserted, as represented in a diagrammatic manner in FIG. 2b.

Figure 3:
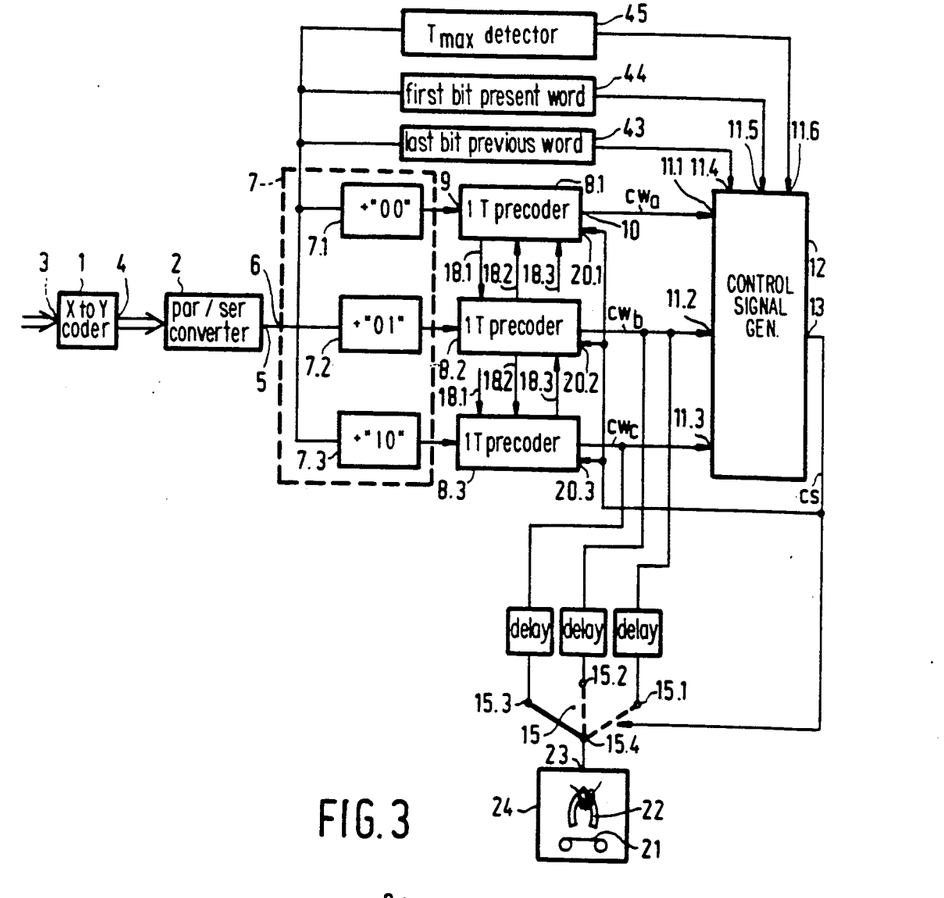
FIG. 3 shows a first exemplary embodiment of the device.

FIG. 3 shows an exemplary embodiment of the device according to the invention comprising an x-to-y coder 1. The coder 1 can be realised, for example, an 8-to-12 encoding. This means that 8-bit digital words are fed to an input 3. By use of a look-up Table in the coder 1 a 12-bit digital word is generated at the output 4 for each 8-bit digital word fed to input 3. The successive 12-bit digital words are applied to a parallel-to-serial converter 2. The output signal of the parallel-to-serial converter 2 has the form as represented (diagrammatically) in FIGS. 1a and 2a. The output signal of the parallel-to-serial converter 2 is thus a run length limited digital signal of the d,k type. The output 5 of the converter 2 is coupled to the input 6 of the signal extending means 7. The signal extending means 7 comprises a first unit 7.1 in which at the instants $t_0, t_1, t_2, \ldots$ the (d+1)-bit digital word "00" is inserted into the data stream applied to the input 6. The unit 7.1 thus generates a data stream at its output which data stream is represented in FIG. 1b, top row of numbers.

In a second unit 7.2, at the instants $t_0, t_1, t_2, \ldots$, the (d+1)-bit digital word "01" is inserted into the data stream. This is shown in FIGS. 1b and 1c by means of the bottom row of numbers in which the digital word "01" is inserted at the instant $t=t_1$.

In a third unit 7.3, at the instants $t_0, t_1, t_2, \ldots$, the (d+b 1)-bit digital word "10" is inserted. This is shown in FIG. 1c in the top row of numbers at the instant $t=t_0$.

The output signals of the unit 7.1, 7.2, and 7.3 are applied to inputs of aT precoders 8.1, 8.2 and 8.3 respectively.

Figure 4:
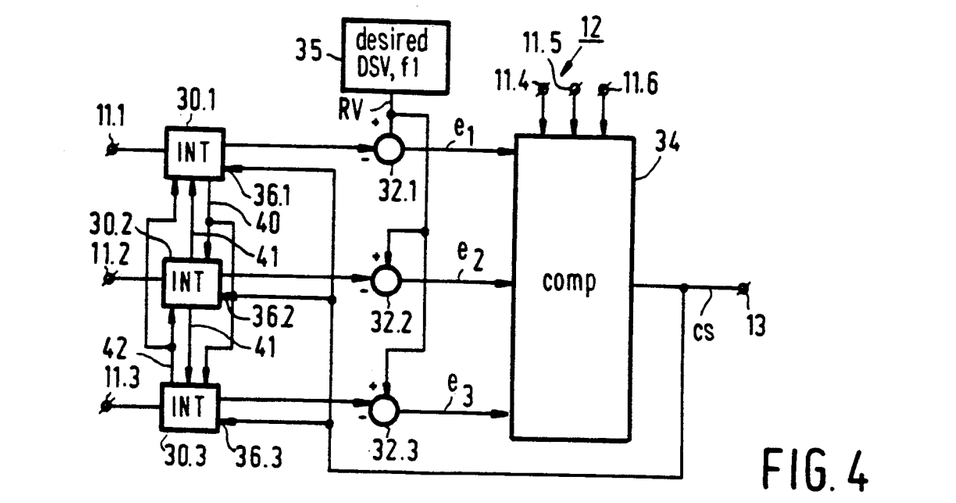
FIG. 4 shows a further embodiment of the control signal generating means.

In the example shown in FIG. 3 a 1T precoding operation is performed on the signal applied to the input of each of the precoders. FIG. 4 shows a 1T precoder used for this purpose.

FIG. 1b shows in the second row of numbers the output signal of the precoder 7.1, the signal according to the top row of numbers in FIG. 1b being applied to the input of the precoder 7.1. Likewise, FIG. 1c shows in the second row of numbers the output signal of the precoder 7.3, the signal according to the top row of numbers in FIG. 1c being applied to the input of the precoder 7.3.

Figure 3A:
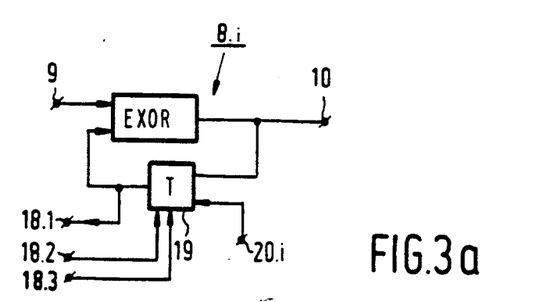
FIG. 3*a* shows a 1 T precoder.

The operation of an aT precoder, more specifically, the 1T precoder as represented in FIG. 3a, is well known. In such a precoder the output signal of the EXOR, present at the output 10, is delayed by 1 clock period T of the input signal and fed back to the input of the EXOR.

The precoder 7.2 encodes in a similar manner the input signal present at the input 6, into which a 2-bit digital word "01" is inserted at the instants $t_0, t_1, t_2, \ldots$.

The output signals of the precoders 8.1, 8.2 and 8.3 are applied to inputs 11.1, 11.2, and 11.3 respectively, of the control signal generating means 12, and further applied through delays to terminals 15.1, 15.2 and 15.3 respectively, of a controllable switching means 15.

The instants $t_0, t_1, t_2, \ldots$ and so on divide the serial data stream of the information signal, cf. FIGS. 1a and 2a, into groups of n bits, referenced information words iw in FIG. 2a, to which d+1 (=2)-bit digital words are extended in the extending means 7 in such a way that these two-bit digital words are prefixed to the information words. The (n+d+1)-bit information words are then converted into (n+d+1)-bit channel words in the precoders. The control signal generating means 12 now generates a control signal cs at the output 13 in response to the signals applied to the inputs 11.1, 11.2 and 11.3, and in response to the information applied to the means 12 through the inputs 11.4, 11.5 and 11.6.

The control signal generating means 12 can generate a first control signal $cs_1$, a second control signal $cs_2$ or a third control signal $cs_3$. These control signals are applied to the switching means 15 and also to the control signal inputs 20.1, 20.2 and 20.3 of the precoders 7.1, 7.2 and 7.3 respectively.

In response to the control signal $cs_1$ the switching means 15 will connect the terminal 15.1 to a fixed terminal 10.4 of the switching means.

If it is a matter of encoding the information word $iw_1$ cf. FIGS. 1a and 2a, the information word encoded by the precoder 8.1 i.e. the channel word $cw_1$, compare FIGS. 1b and 3, will be applied as a channel word $cw_1$ to a recording device 21 via the switching means 13, in which recording device it can be written into a track on a magnetic record carrier 23, for example, by means of a magnetic head.

In response to the control signal $cs_2$ the switching means 15 will have assumed a state in which the terminals 15.2 and 15.4 are coupled to each other so that a channel word $cw_b$ generated by the precoder 8.2 is applied to the recording device 21.

In response to the control signal $cs_3$ the switching means 15 will have assumed a state in which the terminals 15.3 and 15.4 are interconnected so that a channel word $cw_c$ generated by the precoder 8.3 is applied to the recording device 21. The delays in the lines from the precoders to the switching means 15 are intended to compensate for the delay in the detector 12 when the control signal is generated.

In addition, the control signal $cs_1$ applied to the precoders 8.1, 8.2 and 8.3 provides that after the information word $iw_1$ has been encoded in the precoders 8.1, 8.2 and 8.3 and, subsequently, the channel word $cw_a$ generated by the precoder 8.12 is conveyed to the recording device, the contents of the memory 19, compare FIG. 3a, in the precoder 8.1 are conveyed to the precoders 8.2 and 8.3 over the line 18.1 and stored in the memories 19 of these precoders.

In the example of FIG. 1b this means that if the channel word $cw_a$ is applied to the recording device 21, the last bit of this word which is a "1" is stored in the memories 19 of the precoders 8.2 and 8.3 so that for the encoding of the next information word $iw_2$, see FIG. 1a, the contents of the memories in the precoders are again the same. Subsequently, for the encoding of the next information word $iw_2$, again a two-bit digital word is prefixed, see FIG. 1b. Since the last bit of the preceding information word $iw_1$ was a "1", this means that finally only the word "00" of "01" can be prefixed.

Thus, in analogy with the foregoing, the control signal $cs_2$ provides that after the channel word $cw_b$ has been conveyed to the recording device, the contents of the memory 19 in the precoder 8.2 are conveyed to and stored in the memories 19 of the precoders 8.1 and 8.3 through line 18.2, so that also the contents of the memories 19 in the precoders 8.1, 8.2 and 8.3 are equal so that the next information word $iw_2$ can be encoded.

The control signal $cs_3$ provides that the contents of the memory 19 in the precoder 8.3 are conveyed to and stored in the memories 19 of the precoders 8.1 and 8.2 through line 18.3. This is clearly shown in FIGS. 1c and 1d. From FIG. 1d it is apparent that the control signal generating means 12 has generated a third control signal $cs_3$ so that the channel word $cw_c$ is applied to the recording device 21 as $cw_1$, i.e. the encoded information word $iw_1$. The last bit "0" of the channel word $cw_c$ is found in the memory 19 of the precoder 18.3 and is transferred to the memories 19 of the precoders 8.1 and 8.2. Then the precoders encode the information word $iw_2$, see FIG. 1a. This results in the channel word $cw_a$ at the output of the precoder 8.1, see FIG. 1c, and the channel word $cw_b$ at the output of the precoded 8.2, see FIG. 1c. FIG. 1d shows that the generating means 12 subsequently generate a second control signal $cs_2$ so that the channel word $cw_b$ is fed to the recording device 21 as the channel word $cw_2$.

If a first control signal $cs_1$ had just been generated when the information word $iw_1$ was encoded, see FIG. 1b, the precoders 8.1 and 8.2 would have generated the channel words $cw_a$ and $cw_b$ respectively, as shown in FIG. 1b, whilst the information word $iw_2$ was being encoded.

The manner of deriving the control signal cs in the control signal generating means 12 will be explained hereinafter.

A possible exemplary embodiment of the means 12 is shown in FIG. 4. The means comprises integrators 30.1, 30.2 and 30.3 whose inputs are coupled to the respective inputs 11.1, 11.2 and 11.3. The integrator outputs are coupled to first inputs of signal combining elements 32.1, 32.2 and 32.3 respectively. The outputs of the combining elements 32.1, 32.2 and 32.3 are coupled to inputs of a comparator 34, of which an output is coupled to the output 13 of the means 12 for producing the control signal cs. The means 12 optionally comprises a signal generator 35 of which an output is coupled to second inputs of the combining elements 32.1, 32.2 and 32.3. Obviously, if the signal generator 35 is omitted, also the combining elements 32.1, 32.2 and 32.3 can be omitted. The signal combining elements 32.1, 32.2 and 32.3 operate as subtractors as will appear in the following.

Furthermore, the output of the comparator 34 is coupled to control signal inputs 36.1, 36.2 and 36.3 of the respective integrators 30.1, 30.2 and 30.3. In the integrator 30.1 the disparity of the channel word $cw_a$ of precoder 8.1 which word is applied to the input 11.1 is added to a value already present in the integrator. This value corresponds to the current digital sum value of the serial data stream of the channel words as it is applied to the terminal 15.4 of the switching means 15.

In like manner the integrator 30.2 adds the disparity of the channel word $cw_b$ of the precoder 8.2 to a value already present in the integrator 30.2. This value too corresponds to the current digital sum value of the serial data stream of the channel words present at terminal 15.4.

By means of the integrator 30.3 the disparity of the channel word $cw_c$ of precoder 8.3 is added to a value also corresponding to the values stored in the integrators 30.1 and 30.2. The signal generator 35 produces a signal RV corresponding to the desired digital sum value in the serial data stream of the channel words at terminal 15.4. A subtraction in the combining elements 32.1, 32.2 and 32.3 results in three error signals $e_1$, $e_2$, $e_3$ that denote how much the digital sum value in the serial data stream having the channel word $cw_a$, $cw_b$, $cw_c$ respectively, for the last channel word deviates from the desired digital sum value. In the comparator 34 a choice is made for the error signal having the smallest absolute value. So, if the error signal $e_1$ proves to be the smallest, a control signal $cs_1$ will be produced at the output 13 in such a way that the switching means 15 will assume a state so that the terminals 15.1 and 15.4 are coupled to each other. The channel word $cw_a$ can now be applied to the input 23 of the recording device 24 as the next channel word. In addition, in response to this control signal $cs_1$ applied to the control signal inputs 36.1, 36.2 and 36.3 the value in the integrator 30.1 is transferred to the integrators 30.2 and 30.3 through line 40 so that they all have again identical current digital sum values stored in their memories.

If the error signal $e_2$ proves to be the smallest, a control signal $cs_2$ will be produced in such a way that in response thereto the switching means 15 will assume a state so that the terminals 15.2 and 15.4 are coupled to each other. The channel word $cw_b$ is fed to the recording device 24 as the next channel word in the serial data stream of channel words. In addition, in response to the control signal $cs_2$ the value stored in the memory of integrator 30.2 is conveyed to and stored in the memories of the integrator 30.1 and 30.3 through line 41.

If the error signal $e_3$ proves to be the smallest, the control signal $cs_3$ will be produced as a result of which the switching means 15 will assume the state in which the terminals 15.3 and 15.4 are coupled to each other.

The channel words $cw_c$ is conveyed to the recording device 24 as the next channel word in the serial data stream of channel words. In addition, in response to the control signal $cs_3$ applied to the control signal inputs 36.1, 36.2 and 36.3 the value stored in the memory of the integrator 30.3 is conveyed to and stored in the memories of the integrators 30.1 and 30.2 through line 42. If the three error signals prove to be equal it sill always be possible to have the control signal $cs_1$ generated.

Through the inputs 11.4, 11.5 and 11.6 still further signals are applied to the comparator 34. For this purpose, the device represented in FIG. 3 further includes a detector 43 for detecting the last bit of the immediately preceding encoded information word iw, a detector 44 for detecting the first bit of the information word iw which is to be encoded, and a $T_{max}$ detector 45 arranged for determining the maximum number of successive "zeros" found in the serial data stream of the information word to be encoded and the immediately preceding (already encoded) information word in the place of the transition between the two information words. The inputs of detectors 43, 44 and 45 are coupled to the output of the parallel-to-serial converter 2. The output of the detector 43 is coupled to the output 11.4 of the control signal generating means 12, the output of the detector 44 is coupled to the input 11.5 of means 12 and the output of the detector 45 is coupled to the input 11.6 of means 12.

The detector 43 will produce at its output a control signal if the last bit of the immediately preceding information word is a "1". In response to this control signal, applied to the comparator 34 through the input 11.4, the production of the control signal $cs_3$ at the output 13 will be blocked. If the last bit of the immediately preceding information word is a "1", no 2-bit word "10" must be inserted, as has already been observed hereinbefore. Thus, if the error signal $e_3$ proves to be the smallest and if the control signal is present at the input 11.4 no third control signal $cs_3$ will be generated, but the first or the second control signal $cs_1$ or $cs_2$ depending on which error signal $e_1$ or $e_2$ is the smaller after the error signal $e_3$.

The detector 44 will produce at its output a control signal if the first bit of the information word to be encoded is a "1". In response to this control signal conveyed to the comparator 34 through the input 11.5, the production of the control signal $cs_2$ at the output 13 will be blocked. If the first bit of the information word to be encoded is a "1", no 2-bit word "01" must be inserted, as has already been observed hereinbefore. Thus, if the error signal $e_2$ proves to be the smallest and if the control signal is present at the input 11.5 no second control signal $cs_2$ will be generated, but the first or the third control signal $cs_1$ or $cs_3$ depending on which error signal $e_1$ or $e_2$ is the smaller after the error signal $e_2$.

As already observed hereinbefore, for a run length limited signal of the d,k type, it holds that a maximum of k "zeros" may occur successively in the serial data stream of the information words. This also holds for the serial data stream of the (n+d+1)-bit information words applied to the precoder 8.1, if k' is equal to k. The detector 45 will now produce a control signal at its output if the detector 45 detects a number of successive "zeros" between two successive "ones" in the information word to be encoded and the immediately preceding information word, the "one" of the two successive "ones" occurring in the first information word, and the other "one" of the two successive "ones" occurring in the second information word, that is to say, for the case where $p \geq k-1$. k' is in this case taken to be equal to k.

If so, this means that the insertion of the 2-bit digital word "00" leads to the fact that the signal applied to the precoder 8.1 no longer satisfies the requirements of a run length limited signal of the d,k type.

Figure 6:
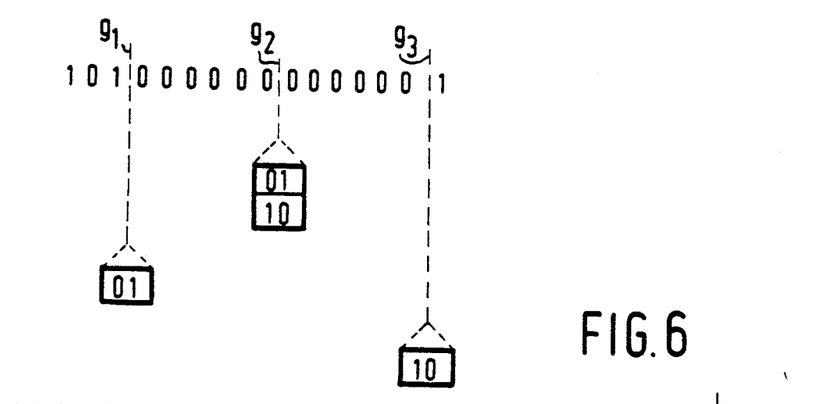
FIG. 6 shows the insertion of a 2-bit digital word.

In response to the control signal applied to the comparator 34 through the input 11.6, the production of the control signal $cs_1$ at the output 13 will be blocked. Thus, if in this case the error signal $e_1$ proves to be the smallest, it will not be the control signal $cs_1$ that is generated at the output 13, but the second or the third control signal $cs_2$ or $cs_3$, on the one hand depending on which error signal $e_2$, $e_3$ is the smaller after the error signal $e_3$, and on the other hand depending on the possible presence of a control signal at the inputs 11.4 and 11.5. In this context reference be made to FIG. 6. FIG. 6 shows a serial data stream of the information words for which it holds that k=12. FIG. 6 thus shows exactly a part of the serial data stream in which a maximum of 12 succeeding "zeros" occurs. This means that the detector 45 generates a control signal. If the boundary between two successive information words is situated at $g_2$, the two-bit digital words "01" or "10" can be inserted. However, if the boundary is situated at $g_1$, also the detector 43 will generate a control signal so that only the 2-bit digital word "01" can be inserted. If the boundary is situated at $g_3$, also detector 44 will generate a control signal so that only the 2-bit digital word "10" can be inserted.

By means of the device described hereinbefore a digital signal free from d.c. current can be realised at the input 23 of the recording device 24. In fact, this is realised because the control is such that the current digital sum value in this signal is set to zero. This can be realised by means of the control signal generator shown in FIG. 4, in the absence of the signal generator 35 and subtractors 32.1, 32.2 and 32.3 or by allowing the generator 35 to produce a zero signal.

This can be explained again with the aid of FIG. 1. FIGS. 1b and 1c show that the current digital sum value, after the encoding of the information word $iw_0$, is equal to 2 (DSV = +2). Subsequently, the information $iw_1$ to which the two-bit word "00" has been extended, is applied to the precoder 8.1 which encodes the (n+d+1-bit) information word into the channel word $cw_a$, cf. FIG. 1b. This channel word is applied to the integrator 30.1 in which the DSV 2 is stored at that moment. Integration of the channel word $cw_a$ is the integrator 30.1 means that the disparity of the channel word $cw_a$ is added to the value already present in the memory of the integrator 30.1. This produces a DSV of +4, cf. FIG. 1b.

In like manner the information word $iw_1$ to which "10" has been prefixed is encoded into the channel word $cw_c$ in the precoder 8.3. As observed hereinbefore, the memory of the integrator 30.3 also contains the DSV equal to 2. Integration of the channel word $cw_c$ in the integrator 30.3 means that the disparity of the channel word $cw_c$ is added to the DSV value already stored in the memory. This produces a DSV of 0, see FIG. 1c. The DSV's in the integrator memories are here directly the error signals. The smallest error signal is in this case $e_3$ so that the channel word $cw_c$ is passed to the recording device 24.

It will be evident that with this control the DSV is adjusted from DSV=+2 to DSV=0. Put in more general terms, the DSV is set to zero with the aid of this control.

By inserting the generator 35 and the subtractors 32.1, 32.2 and 32.3 a pilot signal can be additionally inserted into the digital data stream. The integral of this pilot signal then has the shape of the desired pattern of the digital sum value as a function of time as produced by the generator 35.

Making the encoding free from d.c. current as well as adding a pilot signal to the encoding in the form of a desired pattern of the digital sum value is a prior art technique. For example, reference may be made to aforementioned European Patent Application No. 339,724.

Figure 5:
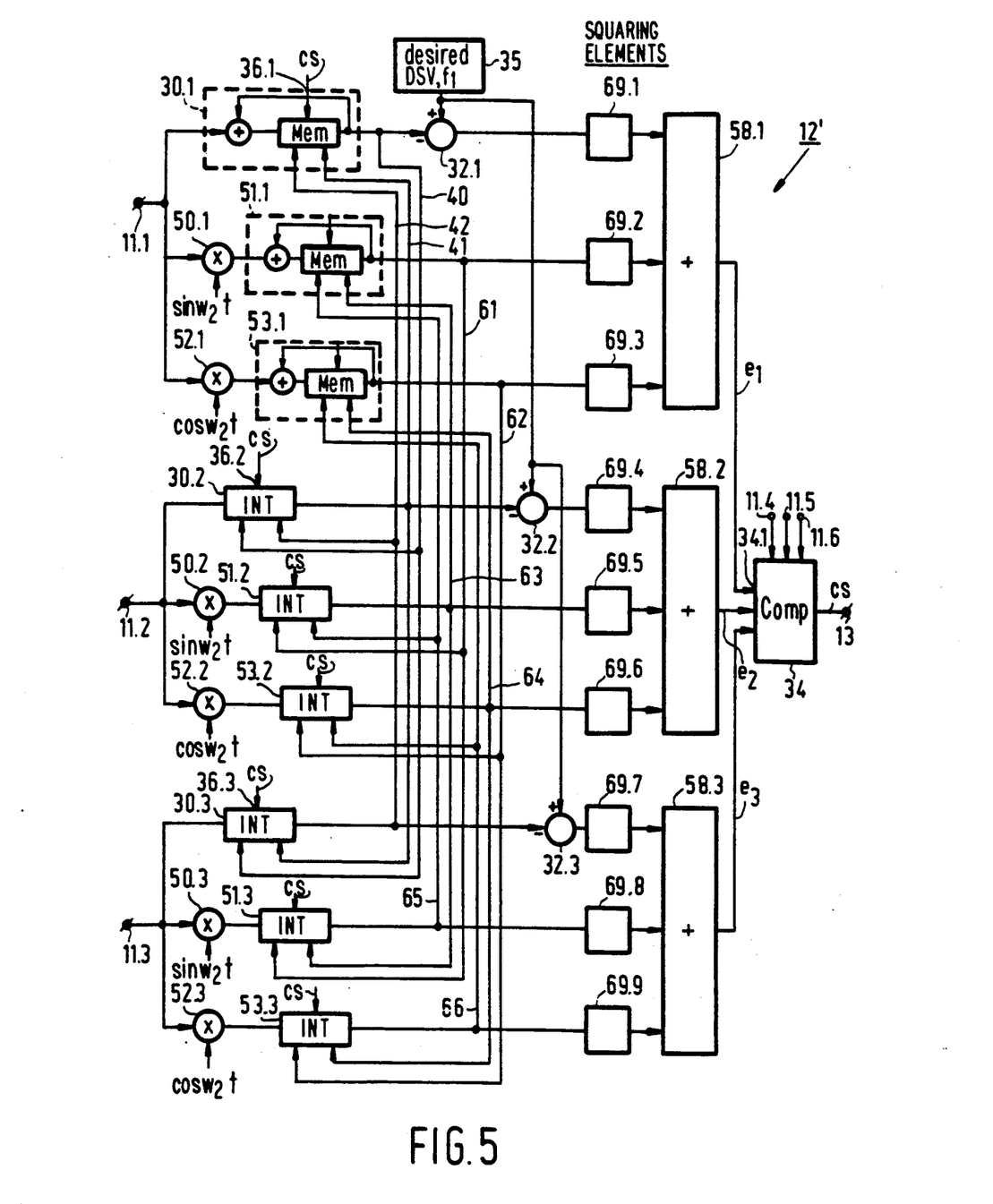
FIG. 5 shows a different embodiment of the control signal generating means.

FIG. 5 shows a different exemplary embodiment of the control signal generating means 12'. With this control signal generating means 12' both a dip at f=0 Hz (i.e. freedom of d.c. current) and a pilot signal at a specific frequency $f_1$, as well as a dip at a second frequency $f_2$ (=w2/$\pi$) can be realised.

Figure 6A:
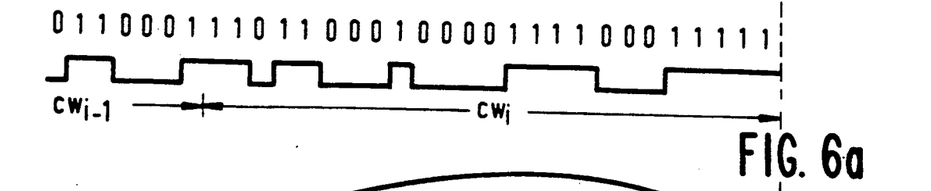
FIGS. 6*a*, 6*b* and 6*c* show a further explanation of the operation of the control signal generating means shown in FIG. 5, in the case where a dip is to be realised at a certain frequency in the frequency spectrum of the data stream of the channel words.

The control signal generating means 12' thereto further includes multipliers 50.1, 50.2, 50.3, 52.1, 52.2 and 52.3, integrators 51.1, 51.2, 51.3, 53.1, 53.2 and 53.3, squaring elements 69.1 to 69.9 and three signal combining elements 58.1, 58.2 and 58.3. In the signal combining elements 58.1, 58.2 and 58.3 the possibly weighted values of the three squaring elements, that is to say, 69.1, 69.2 and 69.3; 69.4, 69.5 and 69.6; 69.7, 69.8 and 69.9 respectively, are added together. In the present example the signal combining elements are constituted by adders. The integrators are constituted in the same manner as the integrators 30.1, 30.2 and 30.3. The channel word $cw_a$ is applied through input 11.1 to first inputs of the multipliers 50.1 and 52.1. In the multipliers 50.1 and 52.1 the channel word $cw_a$ is multiplied by $\sin w_2 t$ and $\cos w_2 t$ respectively. FIG. 6 shows how this multiplication is performed for successive channel words. FIG. 6a shows the serial data stream of the channel words as a function of time i.e. the last channel word and part of the penultimate channel word.

Figure 6B:
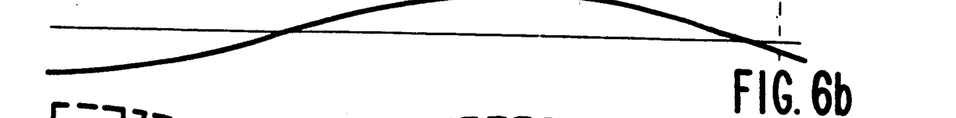
Figure 6C:
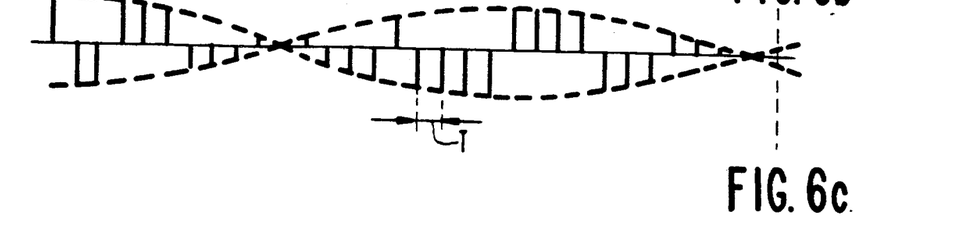

FIG. 6b shows the variation of $\sin w_2 t$ (or $\cos w_2 t$) as a function of time and FIG. 6c the multiplications i.e. successive values of the sine or cosine function respectively. In the integrators 51.1 and 53.1 these values obtained for each channel word cw are added to the value already present in the memories (Mem) in the integrators 51.1 and 53.1 respectively. After each codeword the contents of the memories in the integrators 51.1 and 53.1 are applied via the squaring elements 69.2 and 69.3 to the adder 58.1 and added together and also added to the value present at the output of the subtractor 32.1 after which the result is fed to the adder 58.1 via the squaring element 69.1.

A similar operation in the multipliers 50.2 and 52.2 and the integrators 51.2 and 53.2 is carried out on the codeword $cw_b$ applied to the input 11.2. The output signals of the integrators 51.2 and 53.2 are applied to the adder 58.2 via the squaring elements 69.5 and 69.6 and added to the value present at the output of the subtractor 32.3 applied to the adder 58.2 via the squaring element 69.4.

Similarly holds for the codeword $cw_c$ applied to the input 11.3. The output signals of the adders 58.1, 58.2 and 58.3 are again the error signals $e_1$, $e_2$ and $e_3$ on the basis of which the comparator 34 derives the control signal cs in the manner described hereinbefore.

If the control signal $cs_1$ is generated in the manner described hereinbefore, this control signal is additionally applied to the memories in the integrators 51.2, 51.3, 53.2 and 53.3 and over the lines 61 and 62 the contents of the memories in the integrators 51.1 and 53.1 are transferred to the memories of the integrators 51.2 and 52.3 or 53.2 and 53.3 respectively. Alternatively, if the control signal $cs_2$ is generated, the contents of the memories in the integrators 51.2 and 53.2 are transferred to the memories of the integrators 51.1 and 51.3 or 53.1 and 53.3 respectively through the lines 63 and 64 in response to this control signal.

However, if the control signal $cs_3$ is generated, the contents of the memories in the integrators 51.3, 53.3 are transferred to the memories of the integrators 51.1 and 52.2; 53.1 and 53.2 respectively, in response to this control signal applied to the integrators 51.1, 51.2; 53.1 and 53.2 through lines 65 and 66.

Needless to observe that if an additional dip in the frequency spectrum is desired at a third frequency $f_3$, the control signal generating means 12' is to comprise two additional branches from the input 11.1 to the adder 58.1 while each branch is to comprise a multiplier, an integrator and a squaring element and multiplications by $\sin w_3 t$ and $\cos w_3 t$ respectively, are realised in the multipliers in the two branches ($w_3 = 2\pi f_3$). Two additional branches from the input 11.2 to the adder 58.2 are further necessary which are also to comprise each a series connection of a multiplier, an integrator and a squaring element. The multipliers here too perform multiplications by $\sin w_3 T$ and $\cos w_3 t$. Two additional branches from the input 11.3 to the adder 58.3 are again necessary which are also to comprise each a series connection of a multiplier, an integrator and a squaring element. The multipliers in the two branches again perform multiplications by $\sin w_3 t$ and $\cos w_3 t$ respectively.

In dependence on the generated control signal cs, after each encoding of an information word, the contents of the integrators in the additional branches are made equal in the manner already described with reference to FIG. 5.

It should be observed in this respect with the amplitude of the pilot signal as imposed by the generator 35 in the circuit of FIG. 5 is to be selected in such a way that the control is also capable of realising the dips at one or more frequencies by means of the circuit shown in FIG. 5. This means that the amplitude of the pilot signal in the generator 35 is to be set to an optimum value which is to say, for example, not too large.

Figure 7:
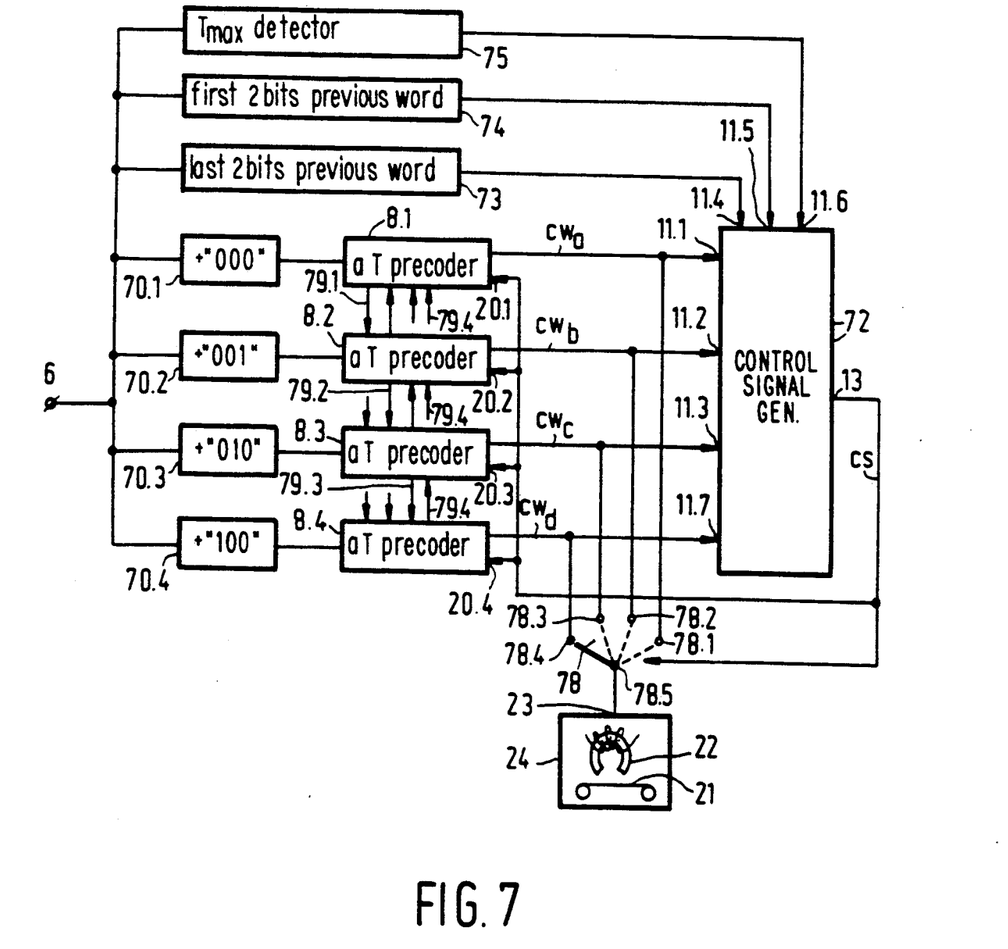
FIG. 7 shows a second exemplary embodiment of the device.

FIG. 7 shows a different exemplary embodiment in which a run length limited signal of the d,k type with d=2 is encoded. This means that in the signal extending means 74 a (d+m=), in the present example a three-bit word is inserted into the serial data stream of the information signal. In view of the requirement relating to d=2 this means that basically only four words that may be three-bit digital words can be inserted, i.e. "000", "001", "010" and "100". This insertion is effected in the units 70.1, 70.2, 70.3 and 70.4 respectively. After encoding in the aT precoders 8.1, 8.2, 8.3 and 8.4 respectively, the (n+3)-bit channel words $cw_a$, $cw_b$, $cw_c$ and $cw_d$ thus obtained are applied to the control signal generating means 72 and also to the respective terminals 78.1, 78.2, 78.3 and 78.4 of a switching means 78 via delay lines (not shown).

The control signal generating means 72 generates a control signal cs from the channel words $cw_a$, $cw_b$, $cw_c$ and $cw_d$. Actually, the means 72 generates either a control signal $cs_1$ or a control signal $cs_2$ or a control signal $cs_3$ or a control signal $cs_4$. The control signal $cs_1$ makes the switching means 78 assume such a state that the terminal 78.1 is coupled to the terminal 78.5 so that the channel word $cw_a$ is applied to the recording device 24. The control signal $cs_1$ is additionally applied to the aT precoders 8.1 to 8.4 and the contents of the memory 19 of the aT precoder 8.1 are applied to the aT precoders 8.2, 8.3 and 8.4 through line 79.1 and stored in the memories of these precoders. The control signal $cs_2$ establishes a connection between the terminal 78.2 and the terminal 78.5 of the switching means 78 so that the channel word $cw_b$ is applied to the recording device 24. In addition, in response to this control signal the contents of the memory in the aT precoder 8.2 are applied to the precoders 8.1, 8.3 and 8.4 through line 79.2 and stored in the memories of these precoders. The control signal $cs_3$ establishes a connection between the terminal 78.3 and the terminal 78.5 so that the channel word $cw_c$ is applied to the recording device 24. In addition, in response to this control signal the contents of the memory in the precoder 8.3 are applied to the precoders 8.1, 8.2 and 8.4 through line 79.3 and stored in the memories of these precoders. The control signal $cs_4$ establishes a connection between the terminal 78.4 and the terminal 78.5 so that the channel word $cw_1$ is applied to the recording device 24. In addition, in response to this control signal $cs_4$ the contents of the memory in the precoder 8.4 are applied to the precoders 8.1, 8.2 and 8.3 through line 79.4 and stored in the memories of these precoders. The control signal generating means 72 can be structured in a manner analogous to those in FIGS. 4 and 5, and is diagrammatically shown in FIG. 9.

Figure 9:
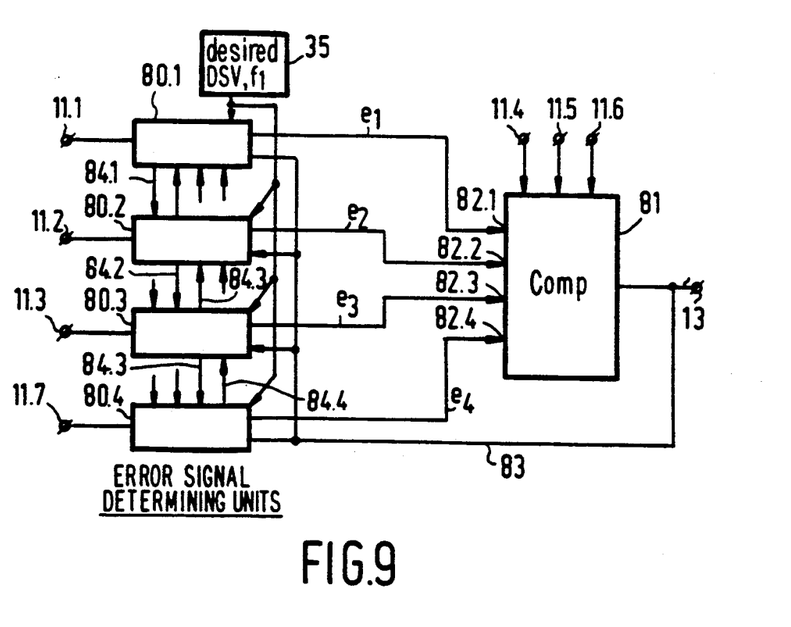
FIG. 9 shows a further explanation of the control signal generating means of the exemplary embodiment shown in FIG. 7.

The inputs 11.1, 11.2, 11.3 and 11.7 of the means 72 are coupled to inputs 82.1, 82.2, 82.3 and 82.4 respectively, of a comparator 81 via error signal determining units 80.1, 80.2, 80.3 and 80.4. An error signal determining unit may be formed by a series connection of an integrator 30.1 and a signal combining element 32.1 as shown in FIG. 4.

If all the units 80.1 to 80.4 are structured in this manner, a d.c. current free encoding can be realised in which a pilot signal is introduced into the encoding at a frequency $f_1$. If, additionally, a dip is desired at a frequency $f_2$, each unit 80.1 to 80.4 will comprise the circuit as shown in FIG. 5 between the input 11.1 and the input 34.1 of the comparator 34. The comparator 81 decides which of the four error signals $e_1$ to $e_4$ is the smallest and generates an appropriate control signal $cs_1$, $cs_2$, $cs_3$ and $cs_4$ respectively. Also in this case the control signal is fed back to the units 80.1 to 80.4 through line 83 so that the contents of the integrator(s) in the unit 80.3

(assuming that $e_3$ is the smallest error signal) are conveyed through line 84.3 to the integrator(s) in the other units 80.1, 80.2 and 80.4 and stored there.

The decision about which controls signal cs is generated by the comparator 81 also depends on the control signals applied to the inputs 11.4, 11.5 and 11.6. The arrangement of FIG. 7 thereto comprises detectors 73, 74 and 75 whose inputs are coupled to the input terminal 6 and whose outputs are coupled to the respective inputs 11.4, 11.5 and 11.6 of the control signal generating means 72. The detector 73 detects the last two bits of the immediately preceding information word that has been encoded and will generated a first control signal if the detector 73 detects the two-bit word "10" and will generate a second control signal if the detector 73 detects the two-bit word "01".

Figure 8:
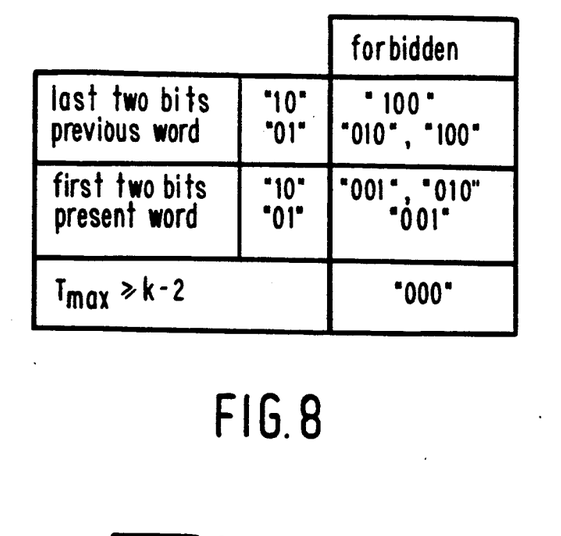
FIG. 8 shows a Table of three-bit words that must not be inserted in a number of situations.

FIG. 8 shows that if the detector 73 detects the two-bit word "10" the three-bit word "100" must not be inserted. This means that in response to the first control signal on the input 11.4, the comparator 81 will not generate a control signal $cs_4$. Which control signal cs the comparator 81 will then start generating at the output 13 has already been discussed in detail with reference to FIGS. 3 and 4. FIG. 8 also shows that if the detector 73 detects the two-bit word "01", the three-bit words "010" and "100" must not be inserted. This means that in response to the second control signal on the input 11.4 the comparator 81 will not generate the control signals $cs_3$ and $cs_4$.

The detector 74 detects the first two bits of the present information word to be encoded and will generate a first control signal if the detector 74 detects the two-bit word "10" and will generate a second control signal if the detector 74 detects the two-bit word "01".

FIG. 8 shows that if the detector 74 detects the two-bit word "10", three-bit words "001" and "010" must not be inserted. This means that in response to the first control signal on the input 11.5 the comparator 81 will not generate the control signals $cs_2$ and $cs_3$. Also shown in FIG. 8 is the fact that if the detector 74 detects the two-bit word "01", the three-bit word "001" must not be inserted. This means that in response to the second control signal on the input 11.5 the comparator 81 will not generate a control signal $cs_2$.

The $T_{max}$ detector 75 will generate a control signal at its output if the detector 75 detects a number of p successive "zero" between two successive "ones" in the serial data stream of the information word to be encoded and the immediately preceding information word, the first "one" of the two successive "ones" occurring in the first and the second "one" of the two successive "ones" occurring in the second information word, for the case where $p \geq k-2$. FIG. 8 also shows that the three bit word "000" must not be inserted in that case. This means that in response to this control signal applied to the input 11.6 the comparator 81 will not generate a first control signal $cs_1$.

Figure 10A:
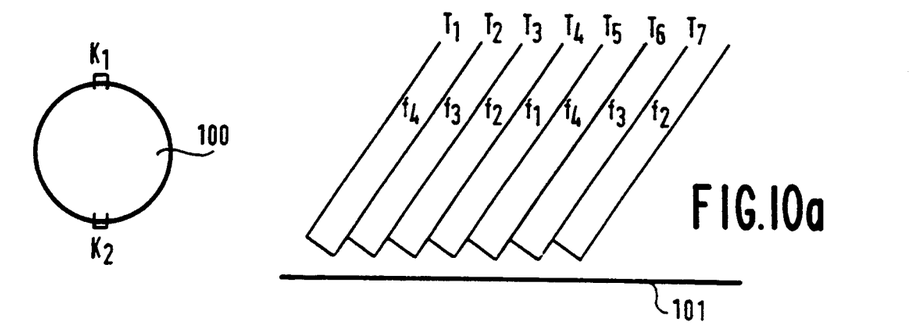
FIG. 10 (*a*, *b* and *c*) shows a number of possible applications of the device according to the invention in a recording device for recording the serial data stream of the channel words on a magnetic record carrier.

FIG. 10 shows a plurality of optional applications of the devices described hereinbefore for magnetic recording of the channel words. FIG. 10a deals with a recording device according to the helical scan principle in which two write heads $K_1$ and $K_2$ are disposed diametrically opposite each other on a rotatable head drum 100. The record carrier is wound around the head drum over 180°. The heads $K_1$ and $K_2$ successively write the tracks $T_1, T_2, T_3$ . . . and so on on the record carrier 101, for example, head $K_2$ for the even tracks and head $K_1$ for the odd tracks.

The devices described hereinbefore extend pilot signals having different frequencies to the channel words to be recorded in successive tracks. FIG. 10a shows cycles of four pilot signals having different frequencies $f_1$, $f_2$, $f_3$ and $f_4$. The frequency characteristic of the signal as written, for example, in track $T_4$ is diagrammatically shown in FIG. 11. Besides the pilot signal at frequency $f_1$ there are also dips at the frequencies $f=0$, $f=f_4$ and $f=f_2$.

Figure 11:
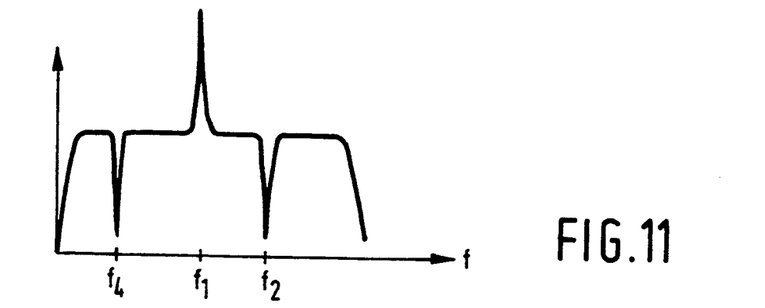
FIGS. 11, and 12 (*a*, *b* and *c*) show a number of frequency characteristics of the serial data stream of the channel words.

The pilot signals have for their aim to realise tracking during reproduction. When this is realised the crosstalk of the pilot signals from the two adjacent tracks $T_3$ and $T_5$ is also read out when the track $T_4$ is read by the head $K_2$. The result is then used for deriving a tracking control signal by means of which the read head is disposed on the track to be read, for example, by activating a piezoelectric element accommodating the head or by controlling the tape transport. Reading the pilot signal crosstalk from the adjacent tracks $T_3$ and $T_5$ means that the crosstalk of the pilot signals $f_2$ and $f_4$ of the tracks $T_3$ and $T_5$ respectively, is to be read out. In order to have this measurement disturbed to the least possible extent by the signal in track $T_4$, the dips are introduced at $f_4$ and $f_4$. It may be evident that the frequency characteristics similar to the frequency characteristic shown in FIG. 11 are valid for the other tracks. The peak then lies at a different frequency ($f_2$, $f_3$ or $f_4$), and so do the dips (at $f_1$ and $f_3$, $f_2$ and $f_4$, $f_3$ and $f_1$ respectively).

The detection of the pilot signal during the reading operation for enabling tracking is extensively discussed in aforementioned European Patent Application No. 339,724, so that no further explanation is necessary here.

Figure 10B:
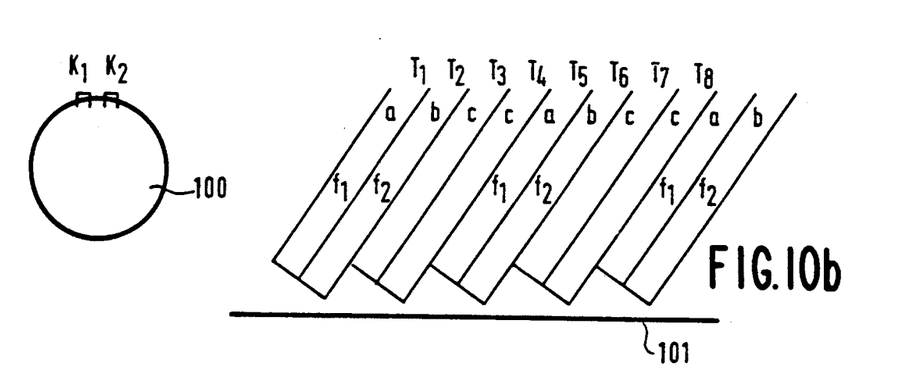

FIG. 10b shows two adjacent and rigidly coupled heads $K_1$ and $K_2$. These heads $K_1$ and $K_2$ write track pairs $T_1$, $T_2$; $T_3$, $T_4$; $T_5$, $T_6$; . . . and so on during successive revolutions of the head drum 100. The record carrier 21 can be wound around the head drum 100 at an arbitrary angle. The letters a, b and c in the tracks of FIG. 10b refer to the frequency characteristics of FIGS. 12a, b and c respectively. These frequency characteristics denote the frequency characteristics of the information recorded in the tracks.

Figure 12A:
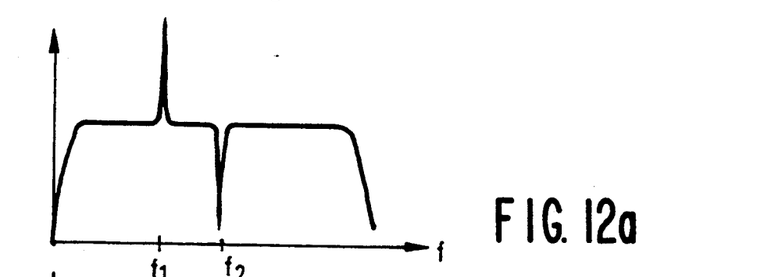
Figure 12B:
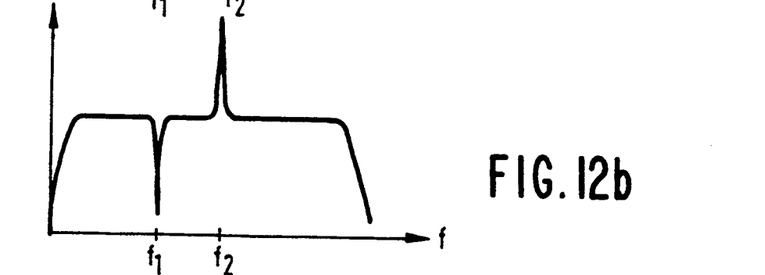

Whilst the track pairs $T_1$ and $T_2$ are read out by the heads $K_1$ and $K_2$ respectively, head $K_1$ which reads the information from track $T_1$ also reads crosstalk of the pilot signal $f_2$ from track $T_2$. In order to realise this track reading in the best possible manner preferably a dip at frequency $f_2$, see FIG. 12a, is introduced in the frequency characteristic of the signal recorded in track $T_1$. Simultaneously, the head $K_2$ reads the information from track $T_2$ and also the crosstalk of the pilot signal $f_1$ from the track $T_1$. Therefore, in the frequency characteristic of the information in the track $T_2$ there is preferably a dip at the frequency $f_1$, see FIG. 12b.

From the crosstalk signals that have been read out a control signal can be derived which can be used to realise tracking during the reading operation. The pair of heads $K_1$ and $K_2$ is thereto accommodated on a piezoelectric element or the tracking is realised by controlling the record carrier velocity.

If the heads $K_1$ and $K_2$ then read the pair of tracks $T_3$, $T_4$, the head $K_1$ reading the track $T_3$ will also detect the crosstalk of the pilot signal $f_2$ from the track $T_2$ and the head $K_2$ the crosstalk of the pilot signal $f_1$ from the track $T_5$. In order to realise the correct tracking control signal, signal inversion is to be applied to both detected crosstalk signals.

Figures 12C, 13:
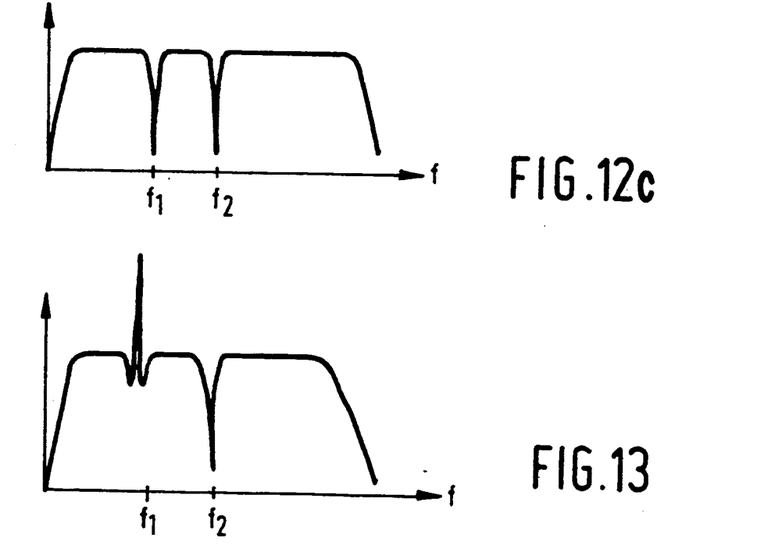
FIG. 13 shows a different frequency characteristic of the serial data stream of the channel words.

For the frequency characteristic of the signals in track $T_3$, see FIG. 12c, it could be sufficient to have a dip at the frequency $f_2$ (and not at the frequency $f_1$) and for the frequency characteristic signal in track $T_4$ a dip at the frequency $f_1$ (and not at the frequency $f_2$). However, for optimum detection of the pilot signal it is still to be preferred to have dips at both frequencies. Furthermore, the phase of the pilot signal $f_1$ in the tracks $T_1$, $T_5$, $T_9$, . . . and so on is shifted through 90° relative to each other so that when the pilot signal is read from a track (for example, $T_5$) this reading operation is affected to the least possible extent by the pilot signals $f_1$ in the tracks $T_1$ and $T_9$. Naturally, the same measure then applied to the pilot signals $f_2$ in the tracks $T_2$, $T_6$, . . . . This measure relates to the fact that synchronous detection is implemented during reproduction.

The detection of the pilot signals in the case of FIG. 10b to realise tracking during reproduction, is extensively discussed in European Patent Application No. 343,726, so that a further explanation may be omitted here.

Figure 10C:
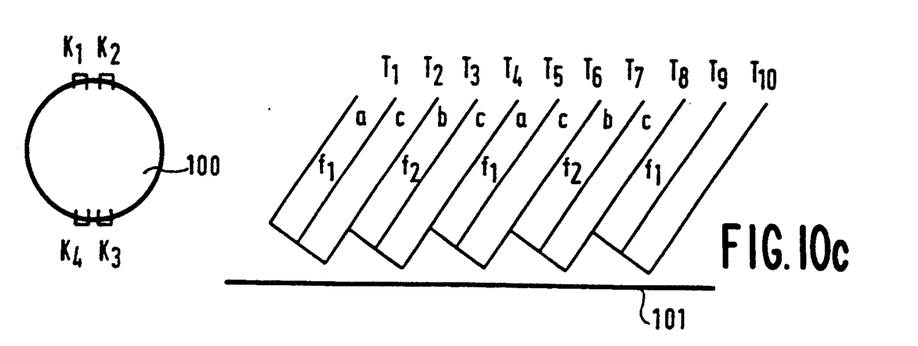

FIG. 10c shows two pairs of heads $K_1$, $K_2$ and $K_3$, $K_4$ disposed diametrically opposite each other on the head drum 100. The record carrier 2 is wound around the head drum 100 over 180°. The head pair $K_1$, $K_2$ always reads track pairs $T_1$, $T_2$; $T_5$, $T_6$; $T_9$, $T_{100}$; . . . and so on. The head pair $K_3$ and $K_4$ always reads the track pairs $T_3$, $T_4$; $T_7$, $T_8$; . . . and so on. The letters a, b and c in the tracks refer to the frequency characteristics in the respective FIGS. 12a, 12b and 12c.

Whilst the track pair $T_1$, $T_2$ is being read out by the head pair $K_1$, $K_2$, the head $K_2$ additionally reads the crosstalk signals of the pilot signals $f_1$ and $f_2$ from the respective tracks $T_1$ and $T_3$. A tracking control signal can be derived from these crosstalk signals that have been read out. Whilst the track pair $T_3$, $T_4$ is being read by the head pair $K_3$, $K_4$, the head $K_4$ additionally reads crosstalk signals of the pilot signals $f_2$ and $f_1$ from the perspective tracks $T_3$ and $T_5$. A tracking control signal can then be derived from these crosstalk signals that have been read out.

Figure 14:
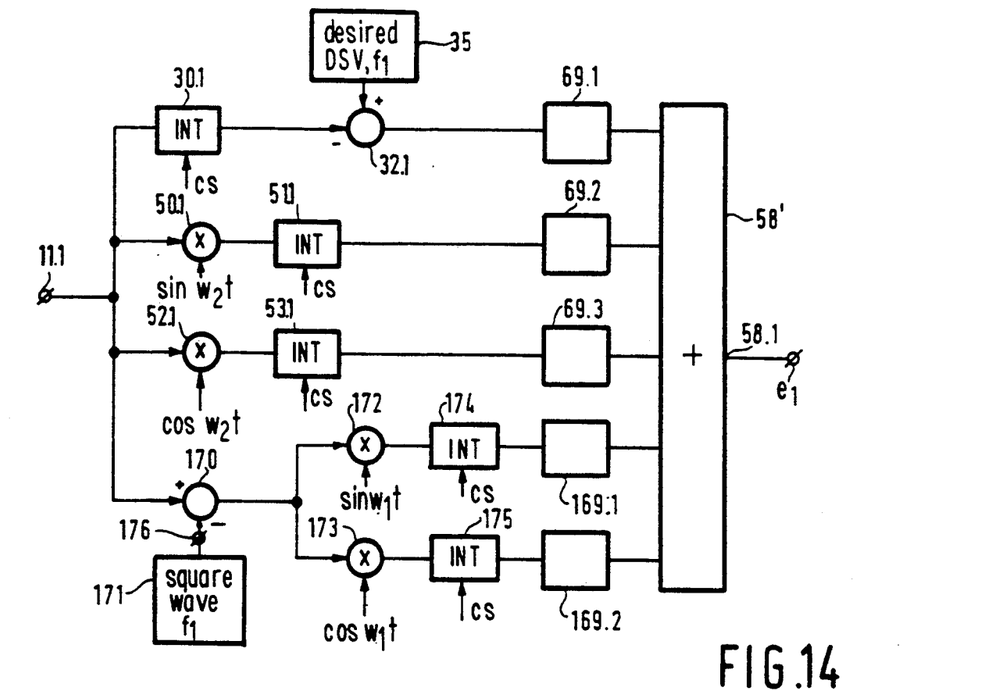
FIG. 14 shows an extension to the control signal generating means shown in FIG. 5.

A further improvement of pilot signal detection, for example, detection of the pilot signal at frequency $f_1$ in FIG. 12a, can be realised by introducing another dip in the frequency spectrum around a frequency $f_1$ during the recording. This is represented in FIG. 13. It is clearly evident that the frequency spectrum is reduced around the frequency $f_1$. This means that the signal-to-noise ratio for the pilot signal detection at the frequency $f_1$ is increased. In order to realise this, the circuit of FIG. 5 needs to be extended. In FIG. 14 this extension is shown but only for part of the circuit of FIG. 5, that is to say, the circuit between the input 11.1 and the input 34.1 of the comparator 34 in FIG. 5.

Figure 15A:
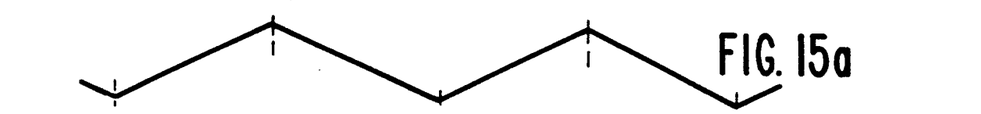
FIGS. 15a and b show two signals occurring in the circuit shown in FIG. 14.
Figure 15B:
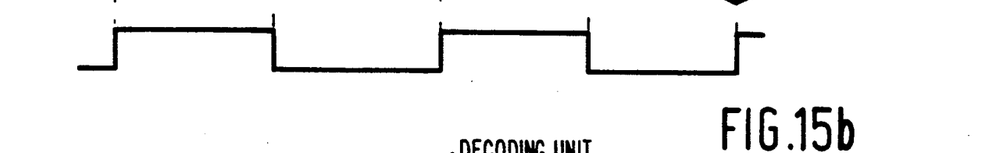

FIG. 14 shows an extension in the form of two additional branches comprising a signal combining element 170 in the form of a subtractor, multipliers 172 and 173, integrators 174 and 175 and squaring elements 169.1 and 169.2. A square wave having the frequency $f_1$ as shown in FIG. 15b is applied to a second input 176 of subtractor 170. This square wave is produced by the source 171 and in fact corresponds to the optimum pilot signal pattern. Source 35 in fact produces the integrated square wave signal as represented in FIG. 15a.

In the subtractor 170 the square wave is subtracted from the signal at input 11.1. The differential signal is applied to multipliers 172 and 173 in which it is multiplied by $\sin w_1 t$ or $\cos w_1 t$ respectively. The signals thus obtained are integrated in integrators 174 which may be structured as the integrator 30.1 shown in FIG. 5, and applied to the adder 58' via squaring elements 169.1 and 169.2 respectively.

Self evidently, there are again two lines each (not shown) leading from the integrators 174 and 175 to the corresponding integrators in the other two sections of the circuit shown in FIG. 5, so that in response to a control signal cs the contents of the corresponding integrators in the three sections can again be made equal after each information word has been encoded.

Figure 16:
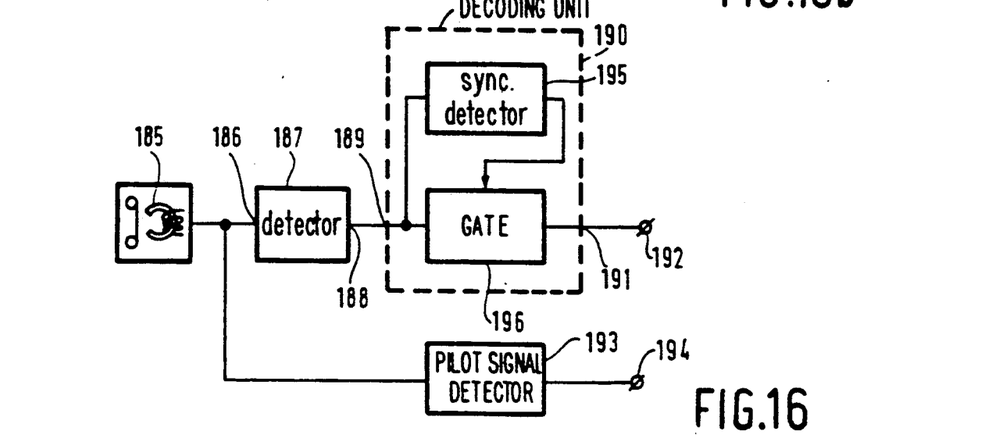
FIG. 16 shows a reproduction device for reading and decoding the serial data stream of the (n+d+m)-bit channel words.

A device for reading the channel words and subsequently decoding these channel words into information words is shown in FIG. 16. The device comprises a read head 185 coupled to an input 186 of a detector 187 whose output 188 is coupled to an input 189 of a decoding unit 190. An output 191 of the decoding unit 190 is coupled to the output terminal 192.

In addition, the output of the read head 185 is coupled to a pilot signal detector 193 comprising, for example, filters having centre frequencies lying near to the frequencies of the pilot signals. The detector 193 therefrom produces the tracking control signal at an output 194. The decoding unit 190 receives at its input the (n+d+m)-bit information words. The decoding unit 190 comprises a synchronising (sync) signal detector 195 for detecting from the serial data stream of information words sync words that have been included in such serial data stream. When a sync word is detected, the decoder 190 knows at what position in the serial data stream of the (n+d+m)-bit information words the (d+m)-bit digital words occur. The control signal supplied by the sync detector 195 to a gating element 196 of decoding unit 190 causes element 196 to remove the (d+m)-bit digital words from the serial data stream of information words. At the output 192 will then appear the original data stream of the n-bit information words.

In this context it is apparent that although hardware designs have been described the device may also be realised in the form of software programming of a microprocessor. It should further be observed that the device as described with reference to the FIGS. 3 and 7 shows a parallel design that, considered over time, the channel words from which, the control signal is derived are generated more or less in parallel. Alternatively, channel words from which a selection can be made may also be generated successively. In that case only a single aT precoder 8.1 is necessary, see FIG. 3, and only a single unit 7.1, which latter unit is then to be capable of extending both a "00" and a "01" and a "10" digital word to an n-bit information word. This would, however, need more memory capacity for temporarily storing the obtained channel words.

What is claimed is:

1. A device for recording a run length limited digital information signal of the d, k type in an information track of a record carrier, comprising:
    an input terminal for receiving the digital information signal
    an encoding device having an input coupled to the input terminal and having an output, which encoding device comprises an aT precoder, where a is an integer greater than or equal to 1 and T is the bit period of the digital information signal; and
    a recording device having an input coupled to the output of the encoding device for recording the encoded digital information signal in the information track on the record carrier;
    characterized in that:
    the encoding device comprises signal extending means for inserting at specific points in time a (d+m)-bit digital word into the digital information signal, where m is an integer greater than or equal to 1;
    the precoder is adapted for converting the extended digital information signal thus obtained into a channel signal for recording in the track on the record carrier;
    the encoding device further comprises control signal generating means for receiving the channel signal and deriving therefrom a control signal; and
    the signal extending means is adapted, in response to said control signal, to insert (d+m)-bit signal words into the digital information signal such that the extended information signal produced by the signal extending means is a run length limited signal of the d,k' type, where k' is an integer greater than or equal to k and, furthermore, the running digital sum value of the precoder output signal has a desired pattern as a function of time.

2. Device as claimed in claim 1, characterized in that a is equal to 1.

3. Device as claimed in claim 1, characterized in that m is equal to 1.

4. Device as claimed in claim 1, characterized in that the signal extending means is arranged for inserting (d+m)-bit digital words into the digital information signal in response to said control signal such that the frequency characteristics of the output signal of the aT precoder has a dip at least at one specific frequency value.

5. Device as claimed in claim 1, characterized in that the signal extending means is arranged for inserting (d+m)-bit digital words into the digital information signal in response to said control signal such that the frequency characteristic of the output signal of the aT precoder has a peak at a specific frequency value.

6. Device as claimed in claim 1, characterized in that d is equal to 1 or 2.

7. Device as claimed in claim 2, characterized in that m is equal to 1.

8. Device as claimed in claim 2, characterized in that the signal extending means is arranged for inserting (d+m)-bit signal words into the digital information signal in response to said control signal such that the frequency characteristic of the output signal of the aT precoder has a dip at least at one specific frequency value.

9. Device as claimed in claim 3, characterized in that the signal extending means is arranged for constantly inserting such a (d+m)-bit digital word into the digital information signal in response to this control signal so that the frequency characteristic of the output signal of the aT precoder shows a dip at at least one specific frequency value.

10. Device as claimed in claim 7, characterized in that the signal extending means is arranged for inserting (d+m)-bit digital words into the digital information signal in response to said control signal such that the frequency characteristic of the output signal of the aT precoder has a dip at least at one specific frequency value.

11. Device as claimed in claim 2, characterized in that the signal extending means is arranged for inserting (d+m)-bit digital words into the digital information signal in response to said control signal that the frequency characteristic of the output signal of the aT precoder shows a peak at a specific frequency value.

12. Device as claimed in claim 3, characterized in that the signal extending means is arranged for inserting (d+m)-bit digital words into the digital information signal in response to said control signal that the frequency characteristic of the output signal of the aT precoder has a peak a specific frequency value.

13. Device as claimed in claim 4, characterized in that the signal extending means is arranged for inserting (d+m)-bit digital word into the digital information signal in response to said control signal that the frequency characteristic of the output signal of the aT precoder has a peak at a specific frequency value.

14. Device as claimed in claim 7, characterized in that the signal extending means is arranged for inserting (d+m)-bit digital word into the digital information signal in response to said control signal that the frequency characteristic of the output signal of the aT precoder has a peak a specific frequency value.

15. Device as claimed in claim 2, characterized in that d is equal to 1 or 2.

16. Device as claimed in claim 3, characterized in that d is equal to 1 or 2.

17. Device as claimed in claim 4, characterized in that d is equal to 1 or 2.

18. Device as claimed in claim 5, characterized in that d is equal to 1 or 2.

19. Device as claimed in claim 7, characterized in that d is equal to 1 or 2.

* * * * *